United States Patent [19]

Wong

[11] 4,118,857
[45] Oct. 10, 1978

[54] FLIPPED METHOD FOR CHARACTERIZATION OF EPITAXIAL LAYERS

[75] Inventor: Theodore T. S. Wong, Maynard, Mass.

[73] Assignee: The United States of America as represented by the Secretary of the Army, Washington, D.C.

[21] Appl. No.: 758,609

[22] Filed: Jan. 12, 1977

[51] Int. Cl.$^2$ .............................................. B01J 17/00
[52] U.S. Cl. ..................................................... 29/574
[58] Field of Search ................ 29/574, 583, 580, 591, 29/584; 148/1.5, 175

[56] References Cited

U.S. PATENT DOCUMENTS

| 3,574,926 | 4/1971 | Le Men | 29/583 |
| 3,619,283 | 11/1971 | Carpenter | 148/175 |
| 3,647,581 | 3/1972 | Mash | 148/175 |
| 3,902,979 | 9/1975 | Thomas | 204/129.3 |

*Primary Examiner*—Gerald A. Dost
*Attorney, Agent, or Firm*—William G. Gapcynski; Werten F. W. Bellamy; Freddie M. Bush

[57] ABSTRACT

A flipped layer method is used to characterize epitaxial layers on a first substrate. A second substrate is attached to the epitaxial layer, and the first substrate and a portion of the epitaxial layer are then removed. Measurements are then performed on the remaining portion of the epitaxial layer.

1 Claim, 5 Drawing Figures

FLIPPED METHOD FOR CHARACTERIZATION OF EPITAXIAL LAYERS

ORIGIN OF THE INVENTION

The present invention was made in the course of a contract DASG60-75-C-0033 with the Department of Army.

DEDICATORY CLAUSE

The invention described herein was made in the course of a contract with the Government and may be manufactured, used, and licensed by or for the Government for governmental purposes without the payment to me of any royalties thereon.

REFERENCE TO CO-PENDING APPLICATION

Reference should be made to my co-pending application entitled "Differential Method for Characterization of Epitaxial layers" having Ser. No. 758,608 and filed Jan. 12, 1977 which is filed on even date herewith and which is assigned to the same assignee as the present application.

BACKGROUND OF THE INVENTION

The present invention is concerned with the characterization of epitaxial layers. The present invention is particularly useful in characterizing epitaxial layers of semiconductor alloys such as mercury cadmium telluride, lead tin telluride, indium arsenide antimonide, gallium arsenide phosphide, and others.

For the purposes of simplicity, the present invention will be described with reference to a particular semiconductor alloy; mercury cadmium telluride. The common chemical equation for mercury cadmium telluride, (Hg,Cd)Te, or $Hg_{1-x}Cd_xTe$, will be used.

Mercury cadmium telluride is an intrinsic photodetector material which consists of a mixture of cadmium telluride, a widegap semiconductor ($E_g = 1.6eV$), with mercury telluride, which is a semimetal having a "negative energy gap" of about 0.3eV. The energy gap of the alloy varies linearly with $x$, the mole fraction of cadmium telluride in the alloy. By properly selecting "$x$", it is possible to obtain mercury cadmium telluride detector material having a peak response over a wide range of infrared wavelengths.

(Hg,Cd)Te is of particular importance as a detector material for the important 8 to 14 micron atmospheric transmission "window". Extrinsic photoconductor detectors, notably mercury doped germanium, have been available with high performance in the 8 to 14 micron wavelength interval. These extrinsic photoconductors, however, require very low operating temperatures (below 30° K). (Hg,Cd)Te intrinsic photodectors having a spectral cutoff of 14 microns, on the other hand, are capable of high performance at 77° K.

At the present time, most (Hg,Cd)Te is produced by bulk growth techniques such as the technique described by P. W. Kruse et al in U.S. Pat. No. 3,723,190. High quality (Hg,Cd)Te crystals are produced by this bulk growth technique.

Epitaxial growth techniques offer a number of potential advantages over bulk growth techniques. An epitaxial layer is a smooth continuous film grown on a substrate, such that the film crystal structure corresponds to and is determined by that of the substrate. The desired epitaxial layer is single crystal with uniform thickness and electrical property. The substrate has a different composition or electrical properties from that of the epitaxial layer.

A number of epitaxial growth techniques have been investigated in an attempt to grow (Hg,Cd)Te layers. Vapor phase epitaxial growth processes which have been studied are described in a number of patents including R. Ruehrwein (U.S. Pat. No. 3,496,024), G. Manley et al (U.S. Pat. No. 3,619,282), D. Carpenter et al. (U.S. Pat. No. 3,619,283), R. Lee et al. (U.S. Pat. No. 3,642,529), and R. Hager et al. (U.S. Pat. No. 3,725,135).

Another epitaxial growth technique which has been investigated is liquid phase epitaxy. This technique is described in R. Maciolek et al. (U.S. Pat. No. 3,902,924). Liquid phase epitaxial growth offers a number of advantages over both vapor phase epitaxial growth and bulk growth of (Hg,Cd)Te.

One characteristic of epitaxial film grown by both vapor phase epitaxy and liquid phase epitaxy is a tendency to exhibit a compositional gradient along the crystal growth direction. This is particularly true when CdTe is used as the substrate material. Examples of compositional profiles through the thickness of epitaxially grown films are shown in FIGS. 3, 5, 6 and 9 of the previously mentioned Hager et al. patent (U.S. Pat. No. 3,725,135) and in FIGS. 4a-4e of the previously mentioned Maciolek et al patent (U.S. Pat. No. 3,902,924).

SUMMARY OF THE INVENTION

The present invention is directed to an improved method of characterizing epitaxial layers. It is based upon the discovery that conventional characterizing techniques, such as Hall effect measurements, are inaccurate in an epitaxial layer such as a mercury cadmium telluride epitaxial layer because the precise thickness of the layer is undefined. This is the result of the variation in composition along the growth direction of the layer.

The method of the present invention overcomes this problem. A second substrate is attached to the epitaxial layer and the original substrate is then removed. In some cases, a portion of the epitaxial layer is also removed. Measurements are then performed on the remaining layer, which has a measurable thickness.

DETAILED DESCRIPTION OF THE PREFERRED EMBODIMENT

The present invention is an improved method of characterizing epitaxial layers. The "flipped" characterization method of the present invention may be used in conjunction with a variety of electrical and optical measurement techniques. One particularly important technique for which the present invention is suited is the Hall effect measurement technique.

Hall effect measurements are important characterization techniques for semiconductor materials. By means of Hall effect measurements, the Hall coefficient, carrier concentration, resistivity, and mobility can be determined for the semiconductor material. In addition, by making Hall effect measurements of several temperatures, it is possible to determine accurately the conductivity type of the semiconductor material.

Conventional Hall effect measurements are not accurate in (Hg,Cd)Te and other semiconductor alloy epitaxial layers because the thickness of the Hall sample is undefined. This is because the epitaxial layer may exhibit a compositional gradient through the thickness of the layer. Other characterization techniques, such as optical tests, may also be inaccurate for the same reason.

The present invention overcomes this problem. Measurements are made on a sample of the epitaxial layer which has a precisely known thickness. In addition, by properly selecting the thickness of the sample, data is obtained only for the top portion of the epitaxial layer, which is the most important portion of the layer for many semiconductor applications.

Figure 1A:
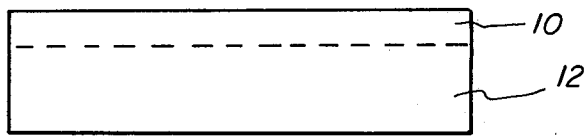
FIGS. 1a-1d illustrate the method of the present invention.

FIGS. 1a-1d describe the method of the present invention. As shown in FIG. 1a, epitaxial layer 10 has been grown on a substrate 12. In one preferred embodiment of the present invention, epitaxial layer 10 is (Hg,Cd)Te which has been grown by liquid-phase epitaxy on a cadmium telluride substrate 12. In FIG. 1a, a boundary between epitaxial layer 10 and substrate 12 is illustrated by a dashed line because the compositional gradient through the thickness of epitaxial layer 10 makes the precise location of the interface between layer 10 and substrate 12 difficult to determine. The precise thickness of epitaxial layer 10, therefore, is undefined.

Figure 1B:
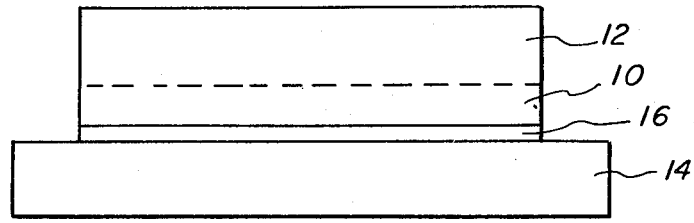

In FIG. 1b, epitaxial layer 10 and substrate 12 have been inverted or "flipped". The outer surface of epitaxial layer 10 has been attached to second substrate 14 by bonding layer 16. The particular composition of substrate 14 and bonding layer 16 is not critical.

Figure 1C:
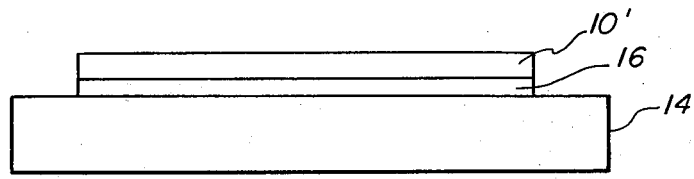

Original substrate 12 is then removed. In addition, it is often preferable to remove a portion of epitaxial layer 10 as well so that the total sample thickness is less than about 20 microns. The removal of substrate 12 and a portion of epitaxial layer 10 is preferably performed by lapping. FIG. 1c shows the remaining portion of the epitaxial layer (designated 10') bonded to second substrate 14 by bonding layer 16.

Figure 1D:
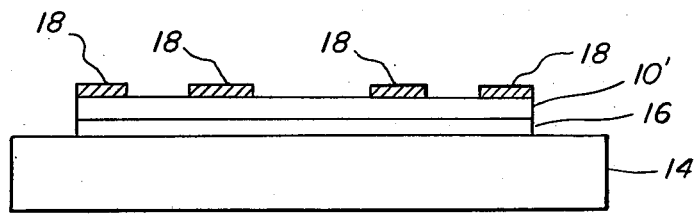

Since remaining portion 10' of the epitaxial layer has a known or measurable thickness, accurate characterization of remaining portion 10' can be made. As shown in FIG. 1d, electrical contact 18 may be attached to the exposed surface of epitaxial layer 10' and various electrical measurements such as Hall effect measurements may be made.

The method of the present invention is particularly advantageous with respect to (Hg,Cd)Te layers formed on (CdTe) substrates. The preferred thickness of the remaining portion 10' of the epitaxial layer is approximately 10 microns. The data obtained from the measurements, therefore, is only from the top 10 microns of the epitaxial layer. It is this portion of the epitaxial layer which is most significant from a photodetector standpoint. The flipped characterization method, therefore, not only provides accurate characterization of the epitaxial layer, but provides data for the most significant portion of the epitaxial layer.

Figure 2:
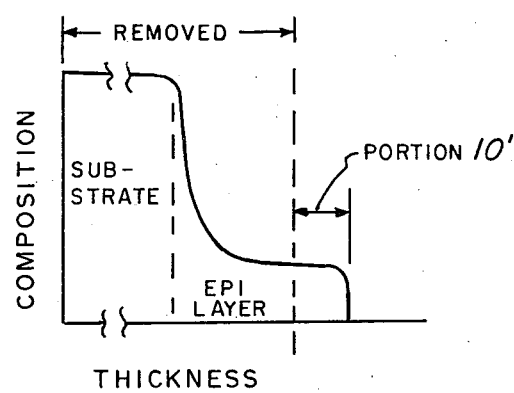
FIG. 2 illustrates the method of the present invention by means of a graph of composition as a function of thickness in an epitaxial layer of (Hg,Cd)Te.

FIG. 2 illustrates the method of the present invention by means of a plot of composition versus thickness for the substrate and the epitaxial layer. As shown in FIG. 2, a compositional gradient exists in the epitaxial layer at the interface of the substrate. The composition is relatively flat in the epitaxial layer as the exterior surface of the epitaxial layer is approached. As shown in FIG 2, the original substrate and part of the epitaxial layer is removed in the method of the present invention leaving a portion 10' which has a relatively constant composition.

In conclusion, the "flipped" characterization method of the present invention provides accurate characterization of epitaxial layers. It is particularly useful in characterizing semiconductor alloy layers such as (Hg,Cd)Te, indium arsenide, antimonide, lead tin telluride, gallium arsenide phosphide, and others. Epitaxial layers of these semiconductors alloys tend to have some compositional variation or gradient through their thickness, causing the thickness of the layer to be undefined.

The method of the present invention is particularly useful for Hall effect measurements of semiconductor epitaxial layers. It is also useful, however, for a wide variety of other characterization techniques of both an electrical and an optical nature. The results of the "flipped" characterization technique are a characterization of the layer at or near the surface. The properties of this portion of the epitaxial layer are generally of the greatest interest.

Although the present invention has been described with reference to the preferred embodiments, workers skilled in the art will recognize that changes may be made in form and detail without departing from the spirit and scope of the invention.

The embodiments of the invention in which an exclusive property or right is claimed are as follows:

1. A method of characterizing an epitaxial layer of semiconductive material on a first substrate, the epitaxial layer having a first surface, the method comprising:
   attaching a second substrate to the first surface;
   removing the first substrate to expose a second surface of the epitaxial layer;
   reducing the thickness of said epitaxial layer by lapping material from said second surface while leaving a remaining epitaxial layer of defined thickness and including said first surface;
   attaching electrical contacts to the exposed surface of said remaining epitaxial layer;
   performing Hall effect measurements on the remaining epitaxial layer for characterizing said layer;
   and wherein the semiconductive material is preferably selected from semiconductor alloys such as indium arsenide antimonide, lead tin telluride, gallium arsenide phosphide, and mercury cadmium telluride.

* * * * *